United States Patent
Fujii et al.

(10) Patent No.: US 12,328,933 B2
(45) Date of Patent: Jun. 10, 2025

(54) SEMICONDUCTOR DEVICE

(71) Applicant: Mitsubishi Electric Corporation, Tokyo (JP)

(72) Inventors: Hidenori Fujii, Tokyo (JP); Shinya Soneda, Tokyo (JP); Takahiro Nakatani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 466 days.

(21) Appl. No.: 17/665,257

(22) Filed: Feb. 4, 2022

(65) Prior Publication Data

US 2023/0049223 A1 Feb. 16, 2023

(30) Foreign Application Priority Data

Aug. 16, 2021 (JP) .................................. 2021-132356

(51) Int. Cl.
*H10D 84/60* (2025.01)
*H10D 8/60* (2025.01)
(Continued)

(52) U.S. Cl.
CPC ............. *H10D 84/617* (2025.01); *H10D 8/60* (2025.01); *H10D 12/481* (2025.01);
(Continued)

(58) Field of Classification Search
CPC ..... H01L 29/78; H01L 21/336; H01L 29/872; H01L 29/868; H01L 29/861;
(Continued)

(56) References Cited

U.S. PATENT DOCUMENTS 6,054,748 A 4/2000 Tsukuda et al.
2009/0283776 A1* 11/2009 Iwamuro ........... H01L 29/66068
438/584

(Continued)

FOREIGN PATENT DOCUMENTS

DE 198 11 568 A1 9/1998
EP 2 741 336 B1 9/2020
(Continued)

OTHER PUBLICATIONS

Hayashida Yuji, Semiconductor Device (machine translation) (Year: 2021).*

(Continued)

*Primary Examiner* — Andres Munoz
*Assistant Examiner* — Ashley Nicole Blackwell
(74) *Attorney, Agent, or Firm* — Studebaker Brackett PLLC

(57) ABSTRACT

According to an aspect of the present disclosure, a semiconductor device includes a substrate including an IGBT region, and a diode region, a surface electrode provided on a top surface of the substrate and a back surface electrode provided on a back surface on an opposite side to the top surface of the substrate, wherein the diode region includes a first portion formed to be thinner than the IGBT region by the top surface of the substrate being recessed, and a second portion provided on one side of the first portion and thicker than the first portion.

14 Claims, 4 Drawing Sheets

(51) Int. Cl.
  *H10D 12/00* (2025.01)
  *H10D 62/83* (2025.01)
  *H10D 62/832* (2025.01)
  *H10D 62/85* (2025.01)

(52) U.S. Cl.
  CPC ..... *H10D 62/8303* (2025.01); *H10D 62/8325* (2025.01); *H10D 62/8503* (2025.01)

(58) Field of Classification Search
  CPC ...... H10D 84/617; H10D 8/60; H10D 12/481; H10D 62/8303; H10D 62/8325; H10D 62/8503; H10D 8/411; H10D 8/00; H10D 64/232; H10D 62/106; H10D 62/115; H10D 64/117; H10D 84/811
  See application file for complete search history.

(56) References Cited

U.S. PATENT DOCUMENTS

| | | | |
|---|---|---|---|
| 2017/0148786 A1* | 5/2017 | Matsushita | ......... H01L 29/8613 |
| 2018/0108737 A1* | 4/2018 | Naito | ................. H01L 29/8613 |
| 2020/0243641 A1 | 7/2020 | Nakagawa et al. | |
| 2022/0149190 A1* | 5/2022 | Kuwano | ........... H01L 29/66143 |
| 2022/0149191 A1 | 5/2022 | Shirakawa et al. | |

FOREIGN PATENT DOCUMENTS

| | | | |
|---|---|---|---|
| JP | 2010114248 A * | | 5/2010 |
| JP | 2013-080796 A | | 5/2013 |
| JP | 2019-161199 A | | 9/2019 |
| JP | 2021-028922 A | | 2/2021 |
| WO | 2021/145080 A1 | | 7/2021 |

OTHER PUBLICATIONS

Sugiyama Takahide, Semiconductor Device (machine translation) (Year: 2010).*

An Office Action mailed by the Japan Patent Office on Apr. 23, 2024, which corresponds to Japanese Patent Application No. 2021-132356 and is related to U.S. Appl. No. 17/665,257; with English translation.

Office Action issued in DE 10 2022 107 993.7; mailed by the German Patent and Trademark Office on Nov. 26, 2024.

* cited by examiner

SEMICONDUCTOR DEVICE

BACKGROUND OF THE INVENTION

Field

The present disclosure relates to a semiconductor device.

Background

JP 2021-28922A discloses a semiconductor device including a semiconductor substrate in which an IGBT region and a diode region that are adjacent to each other are defined. A trench is arranged on an IGBT surface, and a diode surface in a surface of the semiconductor substrate is recessed from the IGBT surface in the surface of the semiconductor substrate. A distance between a back surface on an opposite side to the surface of the semiconductor substrate and a lower end of the trench corresponds to a distance between the back surface of the semiconductor substrate and the diode surface.

In the semiconductor device of JP 2021-28922A, the substrate is thin in the entire diode region. Accordingly, there is a risk that characteristic adjustment may become difficult.

SUMMARY

The present disclosure is made to solve the aforementioned problem and has an object to obtain the semiconductor device in which characteristic adjustment is easily performed.

The features and advantages of the present disclosure may be summarized as follows.

According to an aspect of the present disclosure, a semiconductor device includes a substrate including an IGBT region, and a diode region, a surface electrode provided on a top surface of the substrate and a back surface electrode provided on a back surface on an opposite side to the top surface of the substrate, wherein the diode region includes a first portion formed to be thinner than the IGBT region by the top surface of the substrate being recessed, and a second portion provided on one side of the first portion and thicker than the first portion.

Other and further objects, features and advantages of the disclosure will appear more fully from the following description.

DESCRIPTION OF EMBODIMENTS

The semiconductor device according to each of the embodiments will be described with reference to the drawings. The same or corresponding components are assigned with the same reference signs, and repetition of explanation may be omitted. In the following explanation, n and p indicate conductive types of the semiconductors. The conductive types described in each of the embodiments may be opposite. Further, n$^-$ indicates that the impurity concentration is lower than n, and n$^+$ indicates that the impurity concentration is higher than n. Likewise, p$^-$ indicates that impurity concentration is lower than p, and p$^+$ indicates that impurity concentration is higher than p.

First Embodiment

Figure 1:
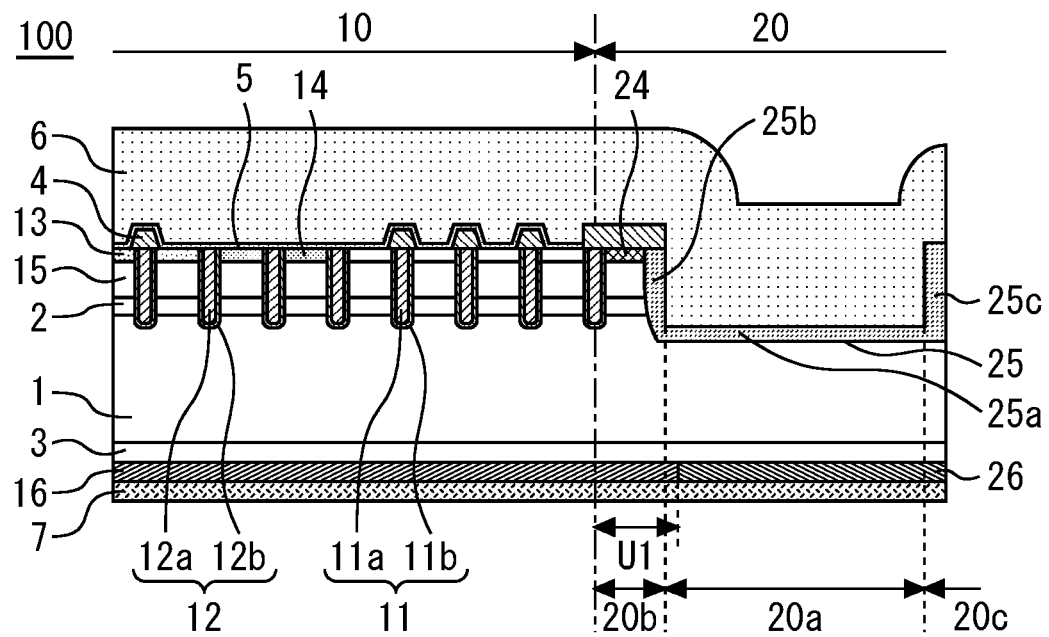
FIG. 1 is a sectional view of a semiconductor device according to a first embodiment.

FIG. 1 is a sectional view of a semiconductor device 100 according to a first embodiment. The semiconductor device 100 includes a substrate having an IGBT region 10, and a diode region 20. The semiconductor device 100 is RC-IGBT (Reverse Conducting IGBT). The IGBT region 10 and the diode region 20 are collectively called a cell region. A termination region not illustrated is provided around the cell region to maintain a withstand voltage of the semiconductor device 100.

In the IGBT region 10, an active trench gate 11 and a dummy trench gate 12 are provided. The active trench gate 11 has a gate trench electrode 11a via a gate trench insulation film 11b in a trench formed in the substrate. The dummy trench gate 12 has a dummy trench electrode 12a via a dummy trench insulation film 12b, in the trench formed in the substrate. The gate trench electrode 11a is electrically connected to a gate pad not illustrated. The dummy trench electrode 12a is electrically connected to a surface electrode 6 provided on a top surface of the substrate. The surface electrode 6 is an emitter electrode.

The substrate has an n$^-$-type drift layer 1. In the IGBT region 10, the substrate is in a range from an n$^+$-type source layer 13 and a p$^+$-type contact layer 14 to a p-type collector layer 16. In the IGBT region 10, an n-type carrier accumulation layer 2 is provided on a top surface side of the n$^-$-type drift layer 1. Note that the n-type carrier accumulation layer 2 may not be provided. The n-type carrier accumulation layer 2 and the n$^-$-type drift layer 1 may be collectively called a drift layer.

A p-type base layer 15 is provided on a top surface side of the n-type carrier accumulation layer 2. The n$^+$-type source layer 13 and the p$^+$-type contact layer 14 configure the top surface of the substrate. The n$^+$-type source layer 13 is provided in contact with the gate trench insulation film 11b. The p$^+$-type contact layer 14 is provided between two adjacent dummy trench gates 12. Note that the p+-type contact layer 14 and the p-type base layer 15 may be collectively called a p-type base layer.

On a back surface side of the n$^-$-type drift layer 1, an n-type buffer layer 3 is provided. The n-type buffer layer 3 may not be provided. The n-type buffer layer 3 and the n$^-$-type drift layer 1 may be collectively called the drift layer. On a back surface side of the n-type buffer layer 3, the p-type collector layer 16 is provided. The p-type collector layer 16 configures a back surface of the substrate. The p-type collector layer 16 is provided not only in the IGBT region 10 but also in the termination region.

An interlayer insulation film 4 is provided on the active trench gate 11. Of the top surface of the IGBT region 10, on a region where the interlayer insulation film 4 is not provided and on the interlayer insulation film 4, a barrier metal 5 is formed. The barrier metal 5 forms an ohmic contact with the n$^+$-type source layer 13, the p$^+$-type contact layer 14 and the dummy trench electrode 12a. The surface electrode 6 is provided on the barrier metal 5. On the back surface on an opposite side to the top surface of the substrate, a back surface electrode 7 is provided. The back surface electrode 7 is a collector electrode. The back surface electrode 7 forms an ohmic contact with the p-type collector layer 16.

The semiconductor device 100 also has the n⁻-type drift layer 1 in the diode region 20. The n⁻-type drift layer 1 in the diode region 20 and the if-type drift layer 1 in the IGBT region 10 are continuously and integrally configured. In the diode region 20, the substrate is a range from a p⁺-type contact layer 24 to an n⁺-type cathode layer 26. On a top surface side of the n⁻-type drift layer 1, a p-type anode layer 25 and the p⁺-type contact layer 24 are provided. The p⁺-type contact layer 24 and the p-type anode layer 25 may be collectively called the p-type anode layer.

In the diode region 20, the n⁺-type cathode layer 26 is provided on a back surface side of the n-type buffer layer 3. The n⁺-type cathode layer 26 configures the back surface of the substrate. In the diode region 20, the surface electrode 6 is an anode electrode, and the back surface electrode 7 is a cathode electrode.

The diode region 20 has a first portion 20a that is formed to be thinner than the IGBT region 10 by the top surface of the substrate being recessed. Further, the diode region 20 has a second portion 20b that is provided on one side of the first portion 20a and is thicker than the first portion 20a, and a third portion 20c that is provided on the other side of the first portion 20a and is thicker than the first portion 20a. The second portion 20b is adjacent to the IGBT region 10.

The p-type anode layer 25 has a portion 25a that is provided along a top surface of the first portion 20a. Further, the p-type anode layer 25 has portions 25b and 25c that are provided along side surfaces of the substrate that connect the first portion 20a, the second portion 20b and the third portion 20c.

In the present embodiment, in the diode region 20, there are a plurality of planes where the surface electrode 6 and the p-type anode layer 25 contact with each other. A depth of the first portion 20a is arbitrary and selectable. The depth of the first portion 20a can be changed according to a mask pattern in mask processing and etching processing conditions. Further, it is also possible to adjust the depth of the first portion 20a by changing a width of the mask pattern.

In the present embodiment, the diode region 20 has a thin portion and thick portions. At this time, it is possible to distribute the p-type anode layer 25 widely in a depth direction. This makes it possible to easily adjust concentrations of the respective portions of the p-type anode layer 25. It is possible to adjust a quantity of injected holes from the p-type anode layer 25 by adjusting the depth and the concentration of the p-type anode layer 25. Thereby, it is possible to adjust an on-voltage and recovery characteristics during forward operation. Accordingly, in the present embodiment, the characteristic adjustment can be easily performed.

Further, when a silicon thickness is thin on an entire surface of the diode region, destruction is likely to occur in a boundary region of the IGBT region and the diode region or a region where a current is concentrated. The region where the current is concentrated is, for example, at a center of the diode region or directly under a wire. Further, chip cracking may occur. Further, steps may be formed in a wide range between the IGBT region and the diode region, and manufacturing is likely to be difficult.

On the other hand, in the present embodiment, the region where the substrate is thin can be limited. Thereby, a wafer warping amount can be suppressed. Further, destruction or chip cracking due to concentration of current can be suppressed, and yield can be improved. Further, it is possible to avoid defocusing during photolithography mask processing and it is possible to reduce a residue after etching, by limiting the step portion. Accordingly, manufacturing of the semiconductor device 100 can be facilitated. From above, in the present embodiment, it is possible to realize facilitation of characteristic adjustment, enhancement in breakdown withstand and facilitation of a manufacturing process.

Further, as shown in FIG. 1, a top surface of the second portion 20b and a top surface of the IGBT region 10 may form a same plane. When a step exists in the boundary region between the IGBT region 10 and the diode region 20, an electric field is likely to be high locally in the step portion. At this time, a withstand voltage is reduced, and there is a risk that destruction easily occurs during switching operation and recovery operation. Since there is no step in the boundary between the IGBT region 10 and the diode region 20, electric field concentration can be suppressed and withstand during reverse bias can be enhanced.

In the example in FIG. 1, the interlayer insulation film 4 is formed on a top surface of the second portion 20b. The second portion 20b may contact with the surface electrode 6 regardless of this. Further, instead of the p⁺-type contact layer 24, the p-type anode layer 25 may be formed. At this time, a concentration gradient may be provided on the p-type anode layer 25 that is adjacent to the IGBT region 10. The concentration of the p-type anode layer 25 is preferably reduced toward the IGBT region. Further, there may be no trench in the boundary of the IGBT region 10 and the diode region 20.

Further, the p-type collector layer 16 provided on a back surface side of the substrate in the IGBT region 10 may protrude into the diode region 20. In other words, in the diode region 20, a back surface side of a portion adjacent to the IGBT region may be the p-type collector layer 16.

When a back surface structure of a boundary region adjacent to the IGBT region 10 is the n⁺-type cathode layer 26, carriers may easily accumulate in the boundary region during forward operation of the diode. Accordingly, there is a risk that a destruction easily occurs at the time of recovery operation. Further, when IGBT is turned on, a snapback phenomenon in which IGBT is not turned on is likely to occur because electrons flow into the n⁺-type cathode layer 26, and holes are hardly injected from the p-type collector layer 16. It is possible to suppress interference of the carriers of IGBT and the diode like this by extending the p-type collector layer 16 to the diode region.

A protrusion amount U1 of the p-type collector layer 16 into the diode region 20 is same as a wafer thickness, for example. In general, current flows within an angle range of 45°. Consequently, if the same distance as the wafer thickness is secured as the protrusion amount U1, interference of the current can be suppressed. The protrusion amount U1 can be arbitrarily set regardless of this. The p-type collector layer 16 and the p-type anode layer 25 may be superposed on each other in plan view, or may not be superposed on each other.

The respective portions 25a, 25b, and 25c of the p-type anode layer 25 may differ from one another in concentration. The p-type anode layer 25 may have the concentration gradient according to the depth.

Figure 2:
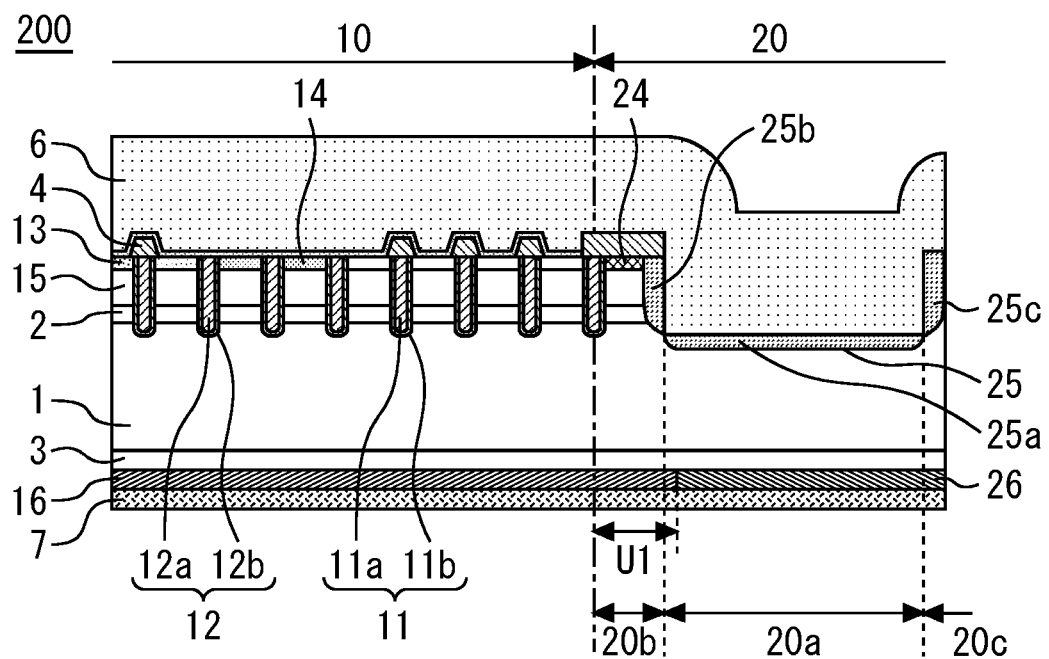
FIG. 2 is a sectional view of a semiconductor device according to a modified example of the first embodiment.

FIG. 2 is a sectional view of a semiconductor device 200 according to a modified example of the first embodiment. Of the p-type anode layer 25, the portions 25a, 25b and 25c may be separated. In other words, an anode may be formed for each of a plurality of planes where the surface electrode 6 and the p-type anode layer 25 contact with each other. It is possible to form the anode for each of the planes by performing injection after setting of the mask pattern in mask processing or etching processing.

Further, in the present embodiment, a height of the diode region 20 has two stages. The height of the diode region 20 may have three or more stages regardless of this.

In the diode region 20, the first portion 20a may be provided only in one spot or a plurality of spots. Any shape may be adopted as a pattern in the plan view of the first portion 20a. The pattern in the plan view of the first portion 20a may be striped, island-shaped or circular. A shape of the first portion 20a can be properly changed according to the mask pattern during mask processing. Further, the diode region 20 has to have the first portion 20a, and a second portion or a third portion provided on one side of the first portion 20a. In other words, a thicker portion than the first portion 20a in the diode region 20 has to be provided on at least one side of the first portion 20a.

Further, in the example in FIG. 1, the first portion 20a is dug down to the same depth as the active trench gate 11. The depth of the first portion 20a is not limited to this. Loss can be further suppressed by digging the first portion 20a below the active trench gate 11. Further, by making the top surface of the first portion 20a equivalent to the bottom portion of the active trench gate 11, increase in the manufacturing cost because the substrate becomes thin can be prevented.

In the semiconductor device 100, the substrate may be made with a wide bandgap semiconductor. A wide bandgap semiconductor is silicon carbide, gallium nitride based material or diamond. According to the present embodiment, it is possible to apply high current stably to the substrate made with a wide bandgap semiconductor by appropriate characteristic adjustment.

These modifications can be appropriately applied to semiconductor devices according to embodiments below. Meanwhile, for the semiconductor devices according to the embodiments below, dissimilarities with the first embodiment will mainly be explained as they have many similarities with the first embodiment.

Second Embodiment

Figure 3:
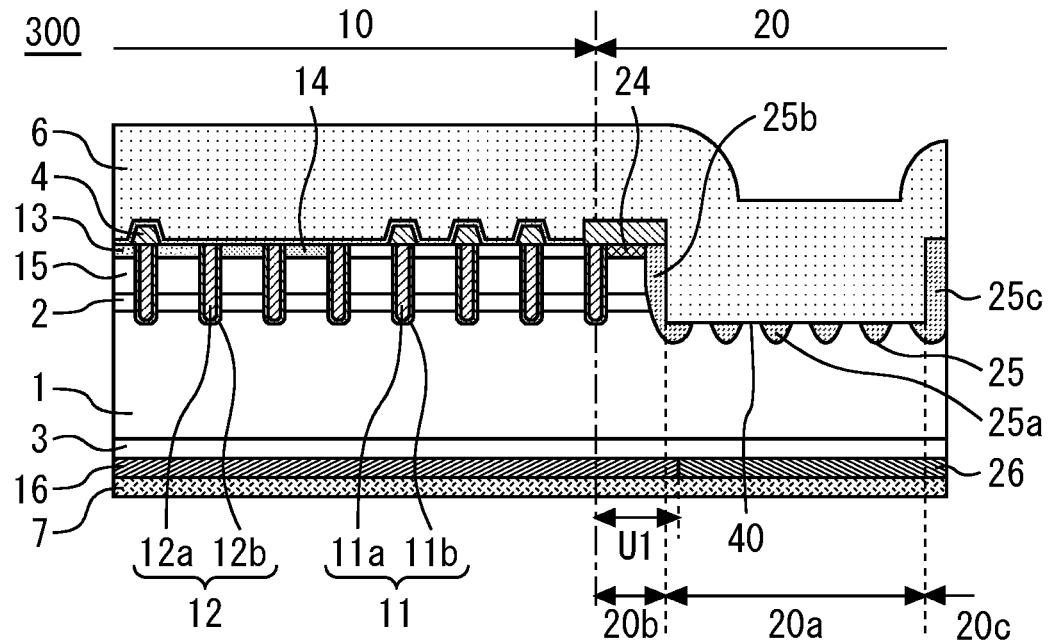
FIG. 3 is a sectional view of a semiconductor device according to a second embodiment.

FIG. 3 is a sectional view of a semiconductor device 300 according to a second embodiment. The semiconductor device 300 differs from the semiconductor device 100 in structure of the first portion 20a. The other components are same as the components of the semiconductor device 100. The first portion 20a of the semiconductor device 300 has the p-type anode layer 25 and a Schottky contact layer 40 on an uppermost layer. An n-type P (phosphorus) may be injected to the Schottky contact layer 40.

In the first portion 20a, an n⁻-type drift layer 1 is thin, so that the current tends to concentrate. By making a part of the p-type anode layer 25 the Schottky contact layer 40 in the first portion 20a, it is possible to suppress the quantity of injected holes during forward operation. This can reduce loss during recovery. Further, it is possible to adjust Trade-off of a forward on-voltage and recovery loss by changing a pattern of the p-type anode layer 25 and the Schottky contact layer 40. Further, the width, concentration or depth of the p-type anode layer 25 may be adjusted so that a depletion layer during reverse bias extends from the p-type anode layer 25 to cover the Schottky contact layer 40. This can suppress a leak current.

An area ratio of the p-type anode layer 25 and the Schottky contact layer 40 is arbitrary. A pattern in plan view of the p-type anode layer 25 and the Schottky contact layer 40 may be striped, island-shaped, a honeycomb-structured, or circular.

Third Embodiment

Figure 4:
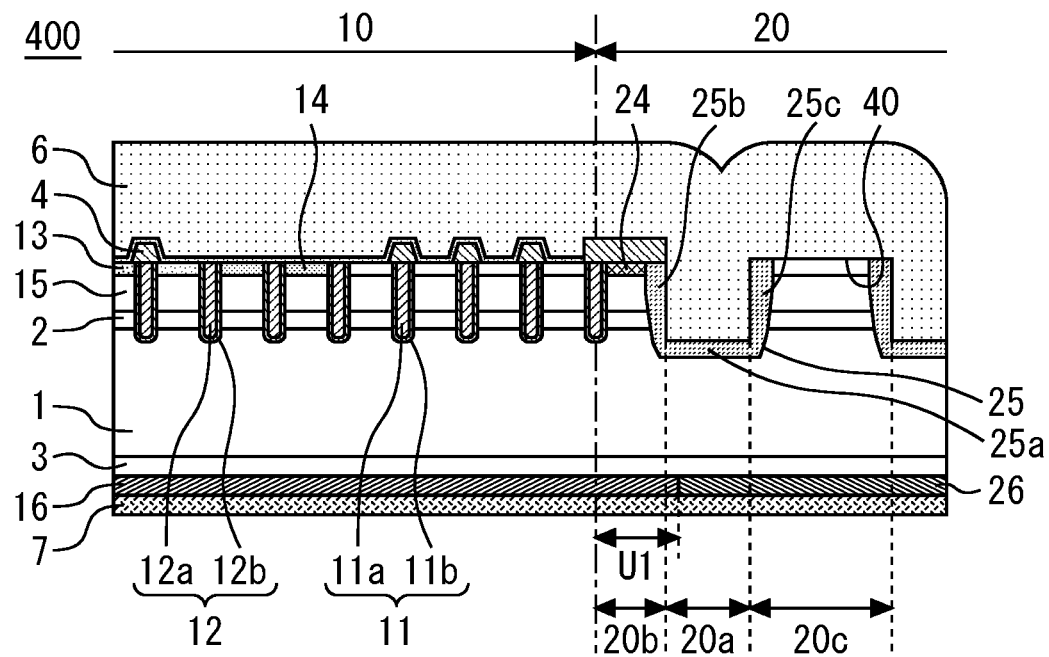
FIG. 4 is a sectional view of a semiconductor device according to a third embodiment.

FIG. 4 is a sectional view of a semiconductor device 400 according to a third embodiment. The semiconductor device 400 differs from the semiconductor device 100 in structure of the diode region 20. The other components are same as the components of the semiconductor device 100. In the semiconductor device 400, a first portion 20a has the p-type anode layer 25 on an uppermost layer, and the third portion 20c has the Schottky contact layer 40 on an uppermost layer.

In general, the Schottky contact layer 40 has a large leak current during reverse bias. Accordingly, in order to block the leak current with a depletion layer extending from the p-type anode layer 25 as in the second embodiment, a pattern shape is likely to be constrained. In the present embodiment, by forming a top surface of the first portion 20a as the p-type anode layer 25, and forming a top surface of a second portion 20b or a third portion 20c as the Schottky contact layer 40, the depletion layer covers the Schottky contact layer 40 during reverse bias more easily. Accordingly, the leak current can be reduced.

An area ratio of the p-type anode layer 25 and the Schottky contact layer 40 is arbitrary. A pattern of the p-type anode layer 25 and the Schottky contact layer 40 in plan view may be striped, island-shaped, honeycomb-structured, or circular. Further, side surfaces of the substrate connecting the first portion 20a and the second portion 20b or the third portion 20c may be the p-type anode layer 25 or the Schottky contact layer 40.

Fourth Embodiment

Figure 5:
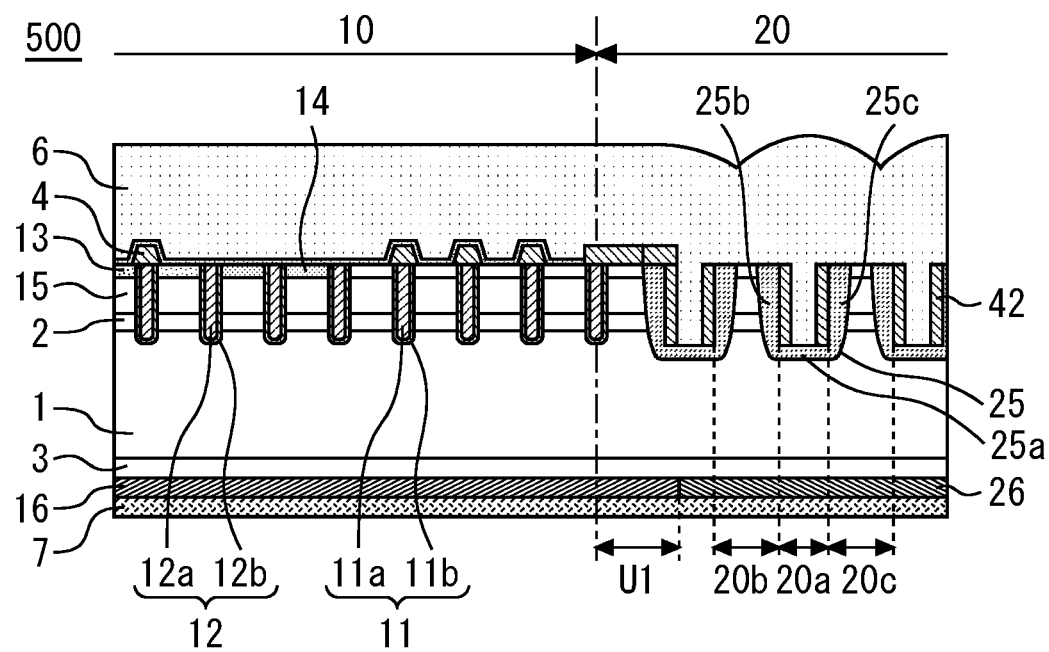
FIG. 5 is a sectional view of a semiconductor device according to a fourth embodiment.

FIG. 5 is a sectional view of a semiconductor device 500 according to a fourth embodiment. In the semiconductor device 500, side surfaces of the substrate connecting the first portion 20a, and the second portion 20b and the third portion 20c are each covered with an oxide film 42. The other structures are same as structures of the semiconductor device 400.

A thickness of the oxide film 42 is arbitrary. The oxide film 42 is formed by, for example, thermal oxidation or CVD (Chemical Vapor Deposition). Further, it is possible to leave the oxide film 42 only on the side surface of the substrate by performing anisotropic etching after the CVD treatment. Further, the oxide film 42 may have a composite film structure. In the composite film structure, for example, an oxide film, polysilicon, and an oxide film are laminated.

In the present embodiment, step portions of the substrate are covered with the oxide film 42. Therefore, current does not flow in the step portion. Accordingly, breakdown withstand during recovery can be enhanced.

In the example shown in FIG. 5, the entire step portions are covered with the oxide film 42. Regardless of this, at least part of the side surfaces of the substrate connecting the first portion 20a, the second portion 20b and the third portion 20c has to be covered with the oxide film 42. For example, only a corner portion on an upper side or a corner portion on a lower side of the side surface of the substrate may be covered with the oxide film 42. In this case, it is also possible to prevent current from concentrating in the corner portion, and it is also possible to enhance breakdown withstand during recovery.

Fifth Embodiment

Figure 6:
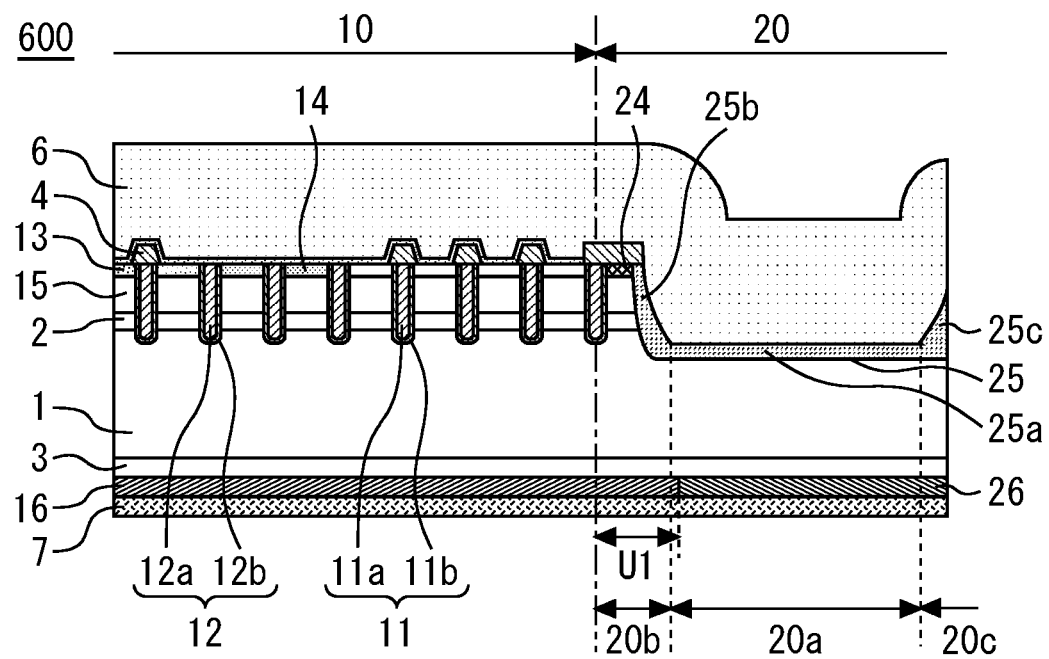
FIG. 6 is a sectional view of a semiconductor device according to a fifth embodiment.

FIG. 6 is a sectional view of a semiconductor device 600 according to a fifth embodiment. In the semiconductor device 600, side surfaces of the substrate connecting the first portion 20a and the second portion 20b are formed of curved surfaces protruding outward. The other components are same as the components of the semiconductor device 100. A shape of a step portion like this can be formed by isotropic etching, for example. Further, a depth of etching can be adjusted by changing fineness of a mask pattern according to the position.

In the present embodiment, a thickness of the p-type anode layer 25 can be brought closer to uniformity as compared with the first embodiment. In particular, in corner portions on lower sides of steps among the first portion 20a, the second portion 20b, and the third portion 20c, the p-type anode layer 25 can be prevented from becoming thin. Accordingly, it is possible to suppress reduction in withstand voltage due to punch-through. Further, it is also possible to suppress concentration of current in the corner portions during recovery, and increase RRSOA (Reverse Recovery Safe Operation Area).

A curvature of the side surface of the substrate is arbitrary. The larger the curvature of the side surface of the substrate is set, the more the p-type anode layer 25 can be prevented from becoming thin in the corner portion. When the curvature of the side surface of the substrate is equivalent to or larger than the curvature of the p-type anode layer 25, a sufficient effect can be obtained.

Sixth Embodiment

Figure 7:
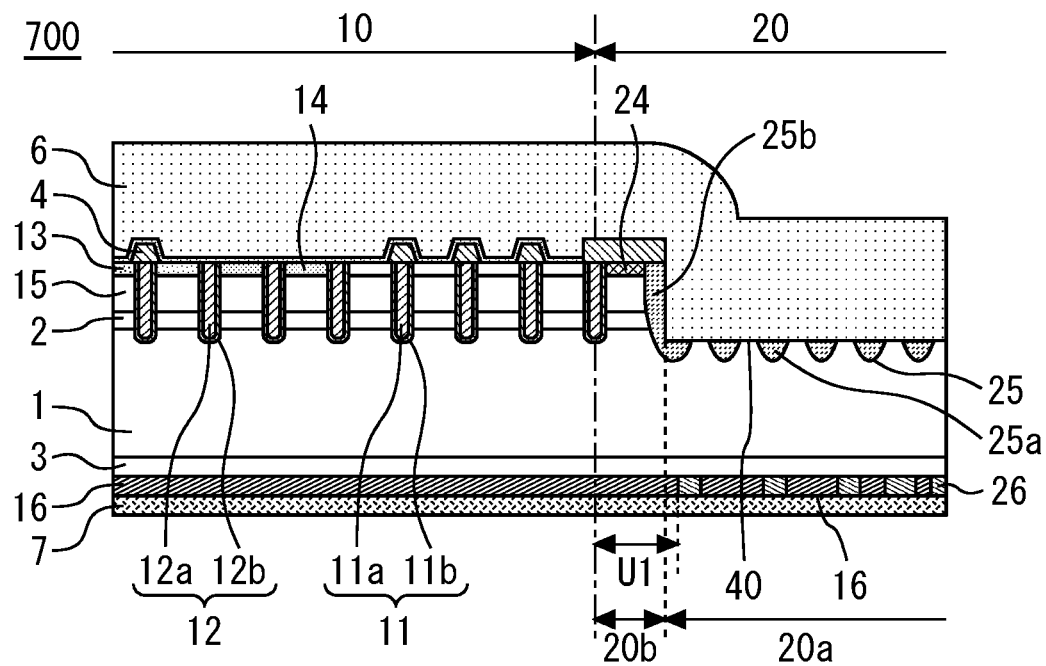
FIG. 7 is a sectional view of a semiconductor device according to a sixth embodiment.

FIG. 7 is a sectional view of a semiconductor device 700 according to a sixth embodiment. The diode region 20 has the $n^+$-type cathode layer 26 on a back surface side of the substrate. In the semiconductor device 700, the $n^+$-type cathode layer 26 is thinned out. Note that in FIG. 7, the structure of the second embodiment is adopted as a structure on a top surface side of the substrate, but the structures of the other embodiments may be adopted.

Next, a forming method of the $n^+$-type cathode layer 26 like this will be described. First, injection is performed to an entire back surface of the substrate, and the p-type collector layer 16 is formed. Next, injection is selectively performed by using a mask pattern, and thereby the $n^+$-type cathode layer 26 is formed. An injection amount of the $n^+$-type cathode layer 26 is set to be larger than an injection amount of the p-type collector layer 16. Further, recrystallization is performed by laser annealing. A difference in concentration cancels out the p-type collector layer 16 in the region where the injection is performed as the $n^+$-type cathode layer 26. As a result, a pattern of the p-type collector layer 16 and the n+-type cathode layer 26 can be formed. A pattern in plan view may be striped, island-shaped, or circular.

By thinning out the $n^+$ type cathode layer 26, injection of electrons from the $n^+$ type cathode layer 26 is suppressed. Accordingly, a tail current during recovery can be reduced. Further, it is possible to adjust Trade-off of a forward on-voltage and recovery loss by changing a ratio of the pattern of the p-type collector layer 16 and the $n^+$ type cathode layer 26.

Further, the $n^+$-type cathode layer 26 may be thinned out more toward an IGBT region 10 side. At this time, a thinning out rate may be inclined toward the IGBT region 10. Further, the $n^+$-type cathode layer 26 may be largely thinned out only in a boundary region with the IGBT region 10. As a result, a carrier concentration on a substrate back surface can be reduced on the IGBT region 10 side. Accordingly, the recovery current can be prevented from concentrating in a corner portion of a step of the diode region 20. This can increase RRSOA.

Seventh Embodiment

Figure 8:
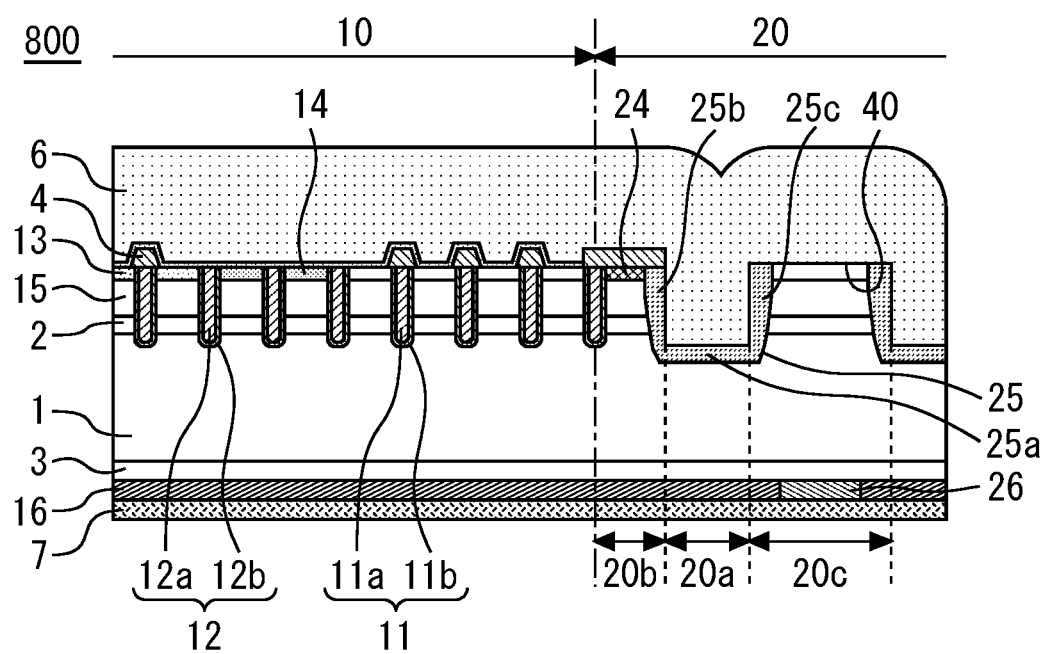
FIG. 8 is a sectional view of a semiconductor device according to a seventh embodiment.

FIG. 8 is a sectional view of a semiconductor device 800 according to a seventh embodiment. In the present embodiment, a structure of the $n^+$-type cathode layer 26 differs from the sixth embodiment. In the semiconductor device 800, the $n^+$-type cathode layer 26 is provided avoiding a place directly under the p-type anode layer 25 of the first portion 20a. Note that in FIG. 8, the structure of the third embodiment is adopted as a structure on a top surface side of a substrate, but the structures of the other embodiments may be adopted.

When the $n^+$-type cathode layer 26 is located under the p-type anode layer 25 of the first portion 20a close to the substrate back surface, a conductivity modulation effect by holes that are injected from the p-type anode layer 25 and electrons that are injected from the $n^+$-type cathode layer 26 increases. Therefore, a recovery loss is likely to increase. In the present embodiment, the $n^+$-type cathode layer 26 is not formed directly under the portion closest to a back surface side, of the p-type anode layer 25. This can reduce the recovery loss.

Further, in the present embodiment, the portion closest to the back surface side of the p-type anode layer 25, the $n^-$-type drift layer 1, and the p-type collector layer 16 form a pnp structure. When the voltage rises during recovery operation, the pnp transistor operates and can suppress a surge voltage.

Meanwhile, technical features explained in each embodiment may be appropriately combined to use.

In the semiconductor device according to the present disclosure, the diode region has a first portion that is formed to be thinner than the IGBT region, and a second portion that is thicker than the first portion. Therefore, characteristic adjustment is easily performed.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2021-132356, filed on Aug. 16, 2021 including specification, claims, drawings and summary, on which the Convention priority of the present application is based, are incorporated herein by reference in its entirety.

The invention claimed is:

1. A semiconductor device, comprising:
a substrate including an IGBT region, and a diode region;
a surface electrode provided on a top surface of the substrate; and
a back surface electrode provided on a back surface on an opposite side to the top surface of the substrate,
wherein the diode region includes a first portion formed to be thinner than the IGBT region by the top surface of the substrate having a recess, a second portion provided on one side of the first portion and thicker than the first portion, and a third portion provided on another side of the first portion and thicker than the first portion,
a top surface of the second portion and a top surface of the IGBT region form a same plane, an anode layer of the diode region is provided along an entire side surface of the substrate connecting the first portion and the second portion and along an entire side surface of the substrate connecting the first portion and the third portion.

2. The semiconductor device according to claim 1, wherein the anode layer of the diode region is provided along a top surface of the first portion.

3. The semiconductor device according to claim 2, wherein of the anode layer, a portion provided along the top surface of the first portion, and a portion provided along the side surface of the substrate connecting the first portion and the second portion are separated.

4. The semiconductor device according to claim 1, wherein the second portion is adjacent to the IGBT region.

5. The semiconductor device according to claim 1, wherein the IGBT region includes a collector layer on the back surface side of the substrate, and the collector layer protrudes into the diode region.

6. The semiconductor device according to claim 1, wherein the first portion includes an other anode layer and a Schottky contact layer on an uppermost layer.

7. The semiconductor device according to claim 1, wherein the first portion includes an other anode layer on an uppermost layer of the first portion, and the second portion includes a Schottky contact layer on an uppermost layer of the second portion.

8. The semiconductor device according to claim 1, wherein at least part of the side surface of the substrate connecting the first portion and the second portion is covered with an oxide film.

9. The semiconductor device according to claim 1, wherein the side surface of the substrate connecting the first portion and the second portion is formed of a curved surface protruding outward.

10. The semiconductor device according to claim 1, wherein the diode region includes a cathode layer on the back surface side of the substrate, and the cathode layer is thinned out.

11. The semiconductor device according to claim 10, wherein the cathode layer is thinned out more toward the IGBT region side.

12. The semiconductor device according to claim 1, wherein the diode region includes a cathode layer on the back surface side of the substrate, and the cathode layer is provided avoiding a place directly under an other anode layer that is included in the first portion.

13. The semiconductor device according to claim 1, wherein the substrate is made with a wide band gap semiconductor.

14. The semiconductor device according to claim 13, wherein the wide band gap semiconductor is silicon carbide, gallium-nitride-based material or diamond.

* * * * *